United States Patent [19]

Radner

[11] Patent Number: 4,772,123
[45] Date of Patent: Sep. 20, 1988

[54] ALIGNMENT OF OPTICAL COMPONENTS

[75] Inventor: Raymond J. Radner, Succasunna, N.J.

[73] Assignee: American Telephone and Telegraph Company, AT&T Bell Laboratories, Murray Hill, N.J.

[21] Appl. No.: 934,198

[22] Filed: Nov. 24, 1986

[51] Int. Cl.⁴ .............................................. G01B 11/26
[52] U.S. Cl. .................................... 356/153; 356/400
[58] Field of Search ............... 356/138, 153, 356, 400, 356/401

[56] References Cited

U.S. PATENT DOCUMENTS 4,538,914 9/1985 Yomoda et al. ................. 356/401 X

FOREIGN PATENT DOCUMENTS 0010751 1/1979 Japan .................................... 356/400

Primary Examiner—Eugene R. Laroche
Assistant Examiner—Robert J. Pascal
Attorney, Agent, or Firm—Michael J. Urbano

[57] ABSTRACT

In the assembly of a device package, an optoelectronic device, such as a light emitting diode (LED) or a photodiode, mounted on a header is aligned with a lens, such as a spherical lens, mounted in a housing by making a light beam from a microscope incident on the lens so that light reflected from the lens creates a symmetrical reference image. Light emitted by the device (LED) or reflected from the device (photodiode) forms an object image of the active area of the device. The two images are detected by a camera and are compared (real-image observation by an operator or electronic image comparison by a computer). The device on an x-y table is moved until the object image is centered with respect to the reference image. Then the position of the device within the package is fixed by epoxying, or otherwise securing, the header to the housing.

11 Claims, 3 Drawing Sheets

ALIGNMENT OF OPTICAL COMPONENTS

BACKGROUND OF THE INVENTION

This invention relates to the alignment of optical components; for example, the alignment of an optoelectronic device to a lens.

In many applications the alignment of optical components along a light transmission axis is a formidable task. High precision mechanical equipment in conjunction with complex automation schemes and sophisticated search algorithms are often required to achieve tight alignment tolerances. For example, one way to align a light emitting diode (LED) to a lens, both in a device package, entails inserting a light fiber probe into the package and moving the LED, while it is energized to emit light, until the maximum intensity detected by the probe is located.

The search algorithms associated with this type of alignment process can be time consuming, with longer times required for LEDs having relatively narrow near-field emission patterns. For example, the alignment of some LEDs to lenses may take from tens of seconds to a few minutes with a mean in excess of one hundred seconds.

Similar comments apply to the alignment of a photodetector to a lens, although the larger active area of most photodetectors, as compared to most LEDs, alleviates some of the difficulty.

The primary difficulty with optimizing search algorithms, minimizing the number of moves required to align the optical components, is the lack of a true and convenient reference to which the movable component can be aligned.

SUMMARY OF THE INVENTION

The need for a reference to facilitate alignment of an optical component to a lens is met in accordance with one embodiment of the invention in which light is made incident on the lens so that a portion of the light is reflected to create an image (e.g., a circle, an annulus or a plurality of dots) which is essentially symmetrical about the center of the lens. The reflected light is detected to generate a reference image, and light emanating from the component (e.g., light emitting from the active area of a LED or light reflected from the active area of a photodetector) is detected to generate an object image of a preselected (e.g., active) area of the component. The two images are compared to one another (e.g., real image comparison by an operator or electronic image comparison in a computer), and the component and the lens are moved relative to one another so that the object image is essentially centered with respect to the reference image.

In a packaging process, typically the component is mounted on a header and the lens is mounted within a housing, and after alignment is effected as above, the header and housing are secured to one another using epoxy or other suitable means.

In addition to providing a true and convenient reference image, the invention is also advantageous because it obviates the need for a fiber optic probe which, in the prior art, needs to be inserted and withdrawn from each package in which components are to be aligned—a tedious and time consuming operation.

BRIEF DESCRIPTION OF THE DRAWING

The invention, together with its various features and advantages, can be readily understood from the following, more detailed description taken in conjunction with the accompanying drawings, in which.

DETAILED DESCRIPTION

Figure 1:
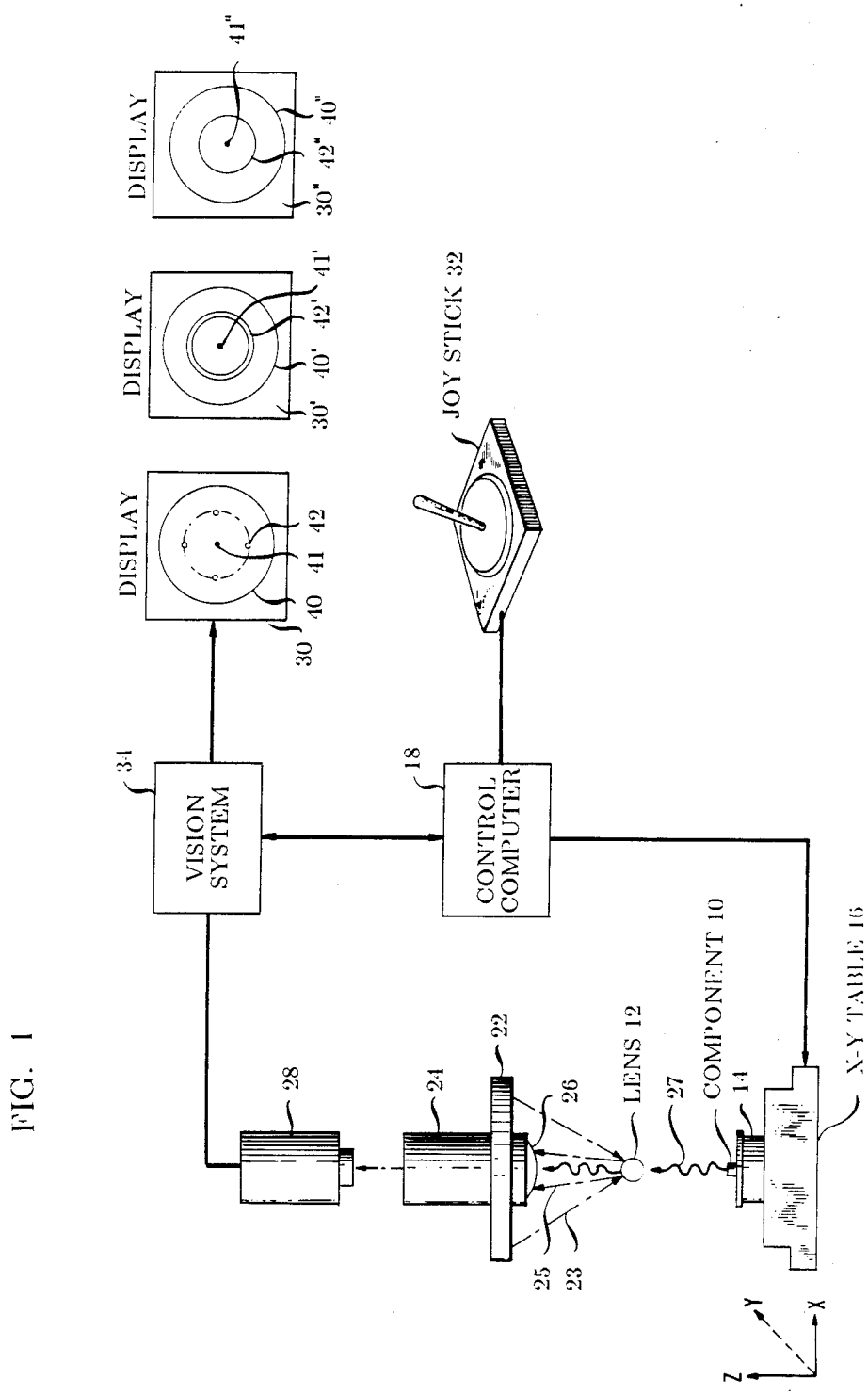
FIG. 1 is a schematic, block-diagrammatic view of apparatus used in practicing one embodiment of the invention.

Turning now to FIG. 1, there is shown a schematic of apparatus for use in aligning an optical component 10 with a lens 12 in accordance with one embodiment of my invention. The component 10 is illustratively mounted on a header 14 which is carried by a movable platform 16, such as an x-y table, under the control of a computer 18. A lens 12, on the other hand, is mounted illustratively in a housing 20, not shown in FIG. 1 but depicted in FIGS. 3 and 4.

The lens 12 and component 10 are viewed through a microscope 24, and the lens is illuminated in one embodiment by means of a light source 22 in the shape of a collar surrounding the microscope. Alternatively, the light source 22 may be incorporated within the microscope 24 so as to illuminate the lens 12 through the objective lens 26 of the microscope. The optical images formed in the microscope 24 are converted to electrical signals by suitable detection means such as CCD (charge-coupled-device) camera 28. The electrical signals may be supplied to a monitor 30 or other suitable display device in order to present visual images to a human operator. The operator, in turn, may utilize a joy stick 32 or other suitable electromechanical manipulator in order to supply a control signal to computer 18 to move the x-y table 16 and hence the component 10 into alignment with the center of lens 12. To facilitate this type of semi-automatic alignment a well-known vision system 34 may be used, for example, to display cross hairs or other fiducial marks which locate the center of the reference image as seen on the monitor.

For fully automatic operation, without human intervention, the electrical signals from camera 28 are also supplied to a vision system 34 which is used to store image information, perform prescribed calculations as to the centers of the images, and provide information to computer 18. The computer is programmed to supply the necessary control signals to move table 16. A suitable vision system is a P256 Vision System manufactured by International Robomation Intelligence (IRI) of Carlsbad, Calif.

Operation of the invention with a vision system is preferred in many applications, especially those where brightness variations, interference patterns, and the like create "noise" in the images. The vision system's ability to process such images and to discriminate between wanted light patterns and unwanted ones improves signal-to-noise ratio.

A true and convenient reference to enable alignment of component 10 and lens 12 is generated in the following way. Light from source 22 is made incident on the lens 12 as shown by the light beams 23. A portion of this light is reflected by lens 12 as shown by light beams 25 to create a reference image which is essentially symmetrical about the center of the lens 12. The reference image may take on a number of symmetrical shapes such as a plurality of dots 42 equally spaced on the circumference of a circle, an annulus 42' or a circle 42" which are shown on the monitors 30, 30' and 30", respectively, of FIG. 1. The shape of the reference image can be obtained by, for example, a suitable mask over the collar light source 22 to produce the dots 42 or the annulus 42'. However, the circular reference image 42" can be obtained by the well-known technique of illumination through the lens 26 of the microscope 24.

For a spherical lens 12 (or other symmetrical curved lens) the reflected light is symmetrical (e.g., circular) and the center (41, 41', 41") of the symmetrical pattern is the true axis of the lens.

In any case, the light 25 reflected from lens 12 is detected by camera 28 to provide the reference image, and the light 27 emanating from component 10 is likewise detected to form an object image of a preselected area of the component. Light emanating from component 10 may constitute, for example, light emitting from the active area of an LED or light reflected from the active area of a photodetector. In the case of an LED, light from source 22 need be focused only on the lens 12 as shown in FIG. 1. However, for a photodetector the light source is first focused on the lens to generate a reference image, which is stored (e.g., in a vision system's memory), and is then focused on the photodetector to generate an object image which may also be stored. In either case, the two images are compared to one another, and the component and the lens are moved relative to one another so that the object image is essentially centered with respect to the reference image.

Figure 2:
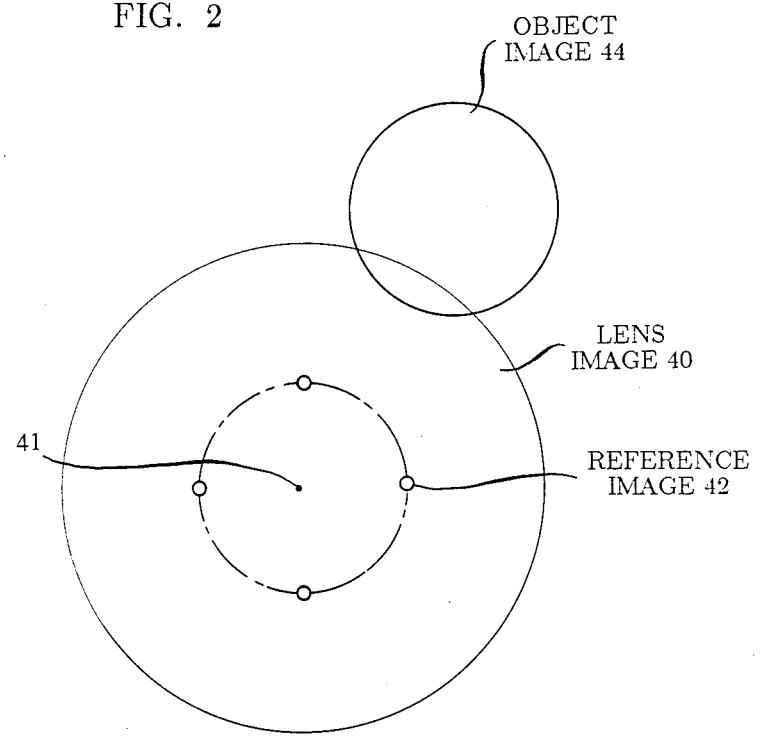
FIG. 2 shows the various lens, reference and object images prior to alignment.

The comparison of the two images may be done semi-automatically utilizing the intervention of a human operator or may be done completely automatically under computer control. In the former case, the operator observes the images on the monitor 30, 30' or 30" which in FIG. 1 shows only the circular image 40, 40' or 40" of the lens 12 and the reference image 42, 42' or 42" for simplicity. However, in the enlarged view of FIG. 2 the object image 44 is also depicted for the embodiment where the reference image includes four dots. Images 40, 40' and 40" have larger diameters than images 42, 42', 42", respectively, because the latter are created by focused light. The operator observes the spatial relationship of the object and reference images, and utilizes the joy stick 32 to move the x-y table 16, and hence the component 10, until the object image 44, 44' or 44" of the component 10 is aligned with, that is essentially centered in, the reference image 42, 42' or 42", respectively.

On the other hand, the intervention of a human operator can be eliminated by supplying the reference and object images directly to the vision system 34 where they are enhanced, modified or otherwise processed. Using commercially available application programs, the vision system calculates the centers of the two images and supplies the coordinates of the centers to computer 18. The computer determines the magnitude and angle of the displacement of table 16 necessary to bring component 10 into alignment with lens 12. Thus, single-step alignment is contemplated provided that x-y table 16 is capable of such movement; if not, multi-step alignment would be used. One such application program, known as a centroid calculator, is supplied with the IRI system. It determines the center of an image based on the area of illuminated pixels in the image. Other programs, such as Robert's Gradient which determines the best circle from an illuminated area (image), can be combined with straight-forward programs for calculating tangents, to determine the center of the object image using basic geometry principles. Once the vision system calculates that center, computer 18 can be used to move the component 10 into alignment with the lens 12.

Figure 3:
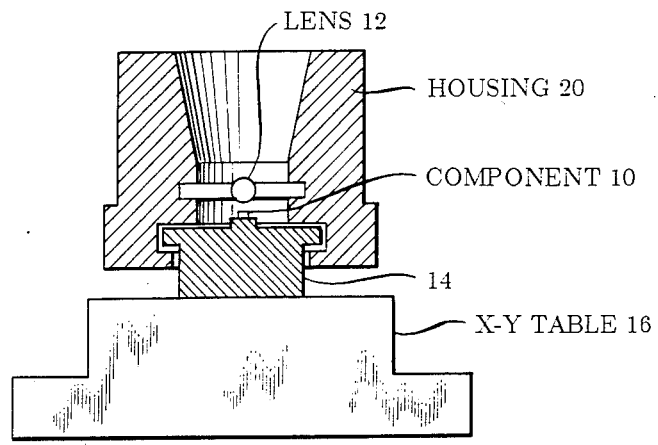
FIG. 3 is a schematic, partial cross-sectional view of a portion of the apparatus of FIG. 1 used to align a LED to a lens.
Figure 4:
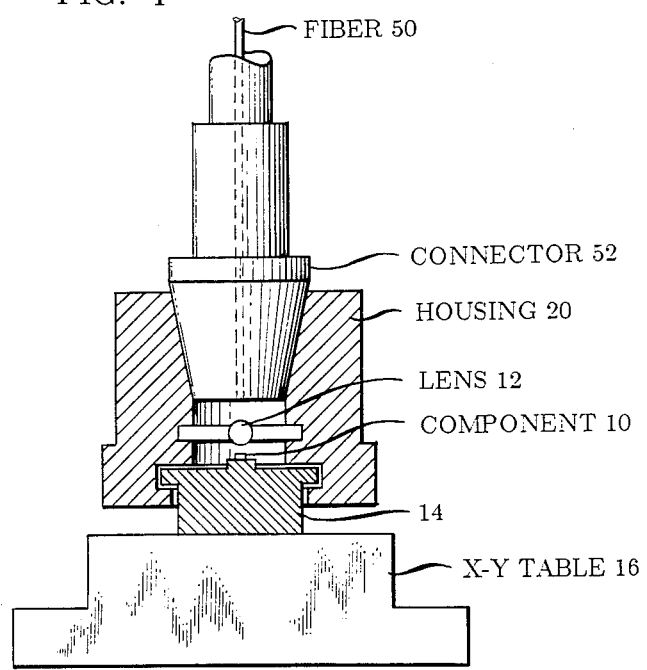
FIG. 4 is a view of the apparatus of FIG. 3 with a fiber optic connector coupled to the LED through the lens, alignment having been achieved in accordance with one aspect of the invention.

After alignment of the component 10 and lens 12 is achieved, most applications require that their relative positions be secured. In the fabrication of lightwave component packages the positions are illustratively fixed by epoxying or otherwise securing the header 14 to the housing 20 as shown in FIGS. 3 and 4. The latter figure also depicts an optical fiber 50 mounted in a biconic connector 52 which is inserted into the housing 20 so that the transmission axis of the fiber 50 is aligned with lens 12 and component 10.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A method of aligning an optical component to a lens comprising the steps of:
    (a) making light incident on the lens so that a portion of the light reflected therefrom creates an image which is essentially symmetrical about the center of the lens,
    (b) detecting the reflected light to provide a reference image for locating the component on the lens axis,
    (c) detecting light emanating from the component to form an object image of a preselected area of the component,
    (d) comparing the images to one another, and
    (e) moving the component and lens relative to one another so that the object image is essentially centered with respect to the reference image.

2. The method of claim 1 wherein step (a) generates a reference image which is essentially circular.

3. The method of claim 1 wherein step (a) generates a reference image which is essentially annular.

4. The method of claim 1 wherein step (a) generates a reference image which is essentially an array of spots.

5. The method of claim 1 wherein the component is a light-emitting diode and the emanating light is emitted from the active area of the diode.

6. The method of claim 1 wherein the component is a photodetector and the emanating light is reflected from the active area of the photodetector.

7. The method of claims 5 or 6 including the additional step of positioning the lens and an optical fiber so that the center of the lens lies essentially on the transmission axis of the fiber.

8. The method of claims 1 to 6, inclusive, including, after step (e), the additional step of fixing the positioning of the component and lens relative to one another.

9. A method of aligning an optoelectronic component to a lens comprising the steps of:

(a) making light incident on the lens so that a portion of the light reflected therefrom passes through a microscope and creates an image which is essentially symmetrical about the center of the lens, (b) detecting the reflected light through the microscope with a camera to generate an electronic reference image for locating the component on the lens axis, (c) detecting light emanating from the component through the microscope with the camera to generate an electronic object image of an active area of the component, (d) supplying the images to a vision system where the images are processed, (e) comparing the processed images to one another to determine the magnitude and orientation of the displacement of the object image with respect to the reference image, and (f) moving the component and lens relative to one another in response to the step (e) comparison so that the component is located on the lens axis.

10. The method of claim 9 wherein step (d) includes determining the centers of the images, and step (e) entails comparing the coordinates of the centers electronically in a computer to generate an error signal indicative of the displacement, and in step (f) the movement occurs automatically in response to the error signal.

11. The method of claim 9 wherein step (d) includes generating a fiducial indicating the center of the reference image, and step (e) entails displaying the images to make a visual comparison, and step (f) includes in part manual manipulation of an electromechanical manipulator to effect the movement.

* * * * *